US010295594B2

(12) United States Patent
Kourfali et al.

(10) Patent No.: US 10,295,594 B2
(45) Date of Patent: May 21, 2019

(54) INTEGRATED CIRCUIT VERIFICATION USING PARAMETERIZED CONFIGURATION

(71) Applicant: UNIVERSITEIT GENT, Ghent (BE)

(72) Inventors: Alexandra Kourfali, Ghent (BE); Dirk Stroobandt, Deinze (BE)

(73) Assignee: UNIVERSITEIT GENT, Ghent (BE)

( * ) Notice: Subject to any disclaimer, the term of this patent is extended or adjusted under 35 U.S.C. 154(b) by 122 days.

(21) Appl. No.: 15/363,066

(22) Filed: Nov. 29, 2016

(65) Prior Publication Data

US 2017/0074932 A1 Mar. 16, 2017

Related U.S. Application Data

(63) Continuation-in-part of application No. PCT/EP2015/062049, filed on May 29, 2015.

(30) Foreign Application Priority Data

May 29, 2014 (EP) .................................... 14170514

(51) Int. Cl.
| | |
|---|---|
| *G01R 31/317* | (2006.01) |
| *G01R 31/3177* | (2006.01) |
| *G06F 17/50* | (2006.01) |
| *G01R 31/3185* | (2006.01) |
| *H03K 19/177* | (2006.01) |

(52) U.S. Cl.
CPC ... *G01R 31/31704* (2013.01); *G01R 31/3177* (2013.01); *G01R 31/31703* (2013.01); *G01R 31/31705* (2013.01); *G01R 31/318519* (2013.01); *G06F 17/5027* (2013.01); *H03K 19/17764* (2013.01); *G06F 2217/14* (2013.01)

(58) Field of Classification Search
CPC ........ G01R 31/31704; G01R 31/31703; G01R 31/31705; G01R 31/3177; G01R 31/318519; G06F 17/5027; G06F 2217/14; H03K 19/17764
USPC ........ 714/733, 724, 725, 736, 742; 716/111, 716/112
See application file for complete search history.

(56) References Cited

U.S. PATENT DOCUMENTS

| | | | | |
|---|---|---|---|---|
| 7,111,199 | B2* | 9/2006 | Leung .............. | G01R 31/31705 714/30 |
| 7,836,366 | B2* | 11/2010 | Sharma .......... | G01R 31/318569 324/528 |
| 8,327,198 | B2* | 12/2012 | Zhong ................. | G06F 11/3648 324/762.03 |
| 8,347,243 | B2 | 1/2013 | Bruneel | |
| 9,201,448 | B2* | 12/2015 | Menon ...................... | G06F 1/12 |
| 9,798,842 | B1* | 10/2017 | Hutton ................ | G06F 17/5031 |

(Continued)

FOREIGN PATENT DOCUMENTS

WO 2009138490 A1 11/2009

OTHER PUBLICATIONS

Hung et al., Incremental Trace-Buffer Insertion for FPGA Debug, 2012, IEEE, pp. 1-15.*

(Continued)

*Primary Examiner* — John J Tabone, Jr.
(74) *Attorney, Agent, or Firm* — Workman Nydegger

(57) ABSTRACT

A method for debugging and a method for testing a circuit design on a programmable logic device is disclosed, making use of a parameterized configuration. A corresponding system also is disclosed.

20 Claims, 6 Drawing Sheets

(56) References Cited

U.S. PATENT DOCUMENTS

| | | | | |
|---|---|---|---|---|
| 2004/0064770 A1* | 4/2004 | Xin | G01R 31/318555 | 714/726 |
| 2004/0205404 A1* | 10/2004 | Johnson | G01R 31/31705 | 714/30 |
| 2004/0230884 A1* | 11/2004 | Rajski | G01R 31/318566 | 714/742 |
| 2005/0204231 A1* | 9/2005 | Mukherjee | G11C 29/10 | 714/733 |
| 2005/0262396 A1* | 11/2005 | Woodward | G01R 31/3177 | 714/30 |
| 2005/0273671 A1* | 12/2005 | Adkisson | G06F 11/348 | 714/43 |
| 2006/0015775 A1* | 1/2006 | Benavides | G06F 11/25 | 714/30 |
| 2006/0041803 A1* | 2/2006 | Woodward | G01R 31/3177 | 714/724 |
| 2007/0136700 A1* | 6/2007 | Wang | G01R 31/31704 | 716/112 |
| 2007/0168730 A1* | 7/2007 | Memmi | G01R 31/3177 | 714/30 |
| 2008/0162071 A1* | 7/2008 | Stevens | G01R 31/31705 | 702/122 |
| 2011/0185110 A1* | 7/2011 | Smigelski | G06F 21/79 | 711/103 |
| 2011/0276850 A1* | 11/2011 | Luu | G06F 11/27 | 714/733 |
| 2012/0005547 A1* | 1/2012 | Chang | G06F 11/261 | 714/734 |
| 2012/0124435 A1* | 5/2012 | Eaton | G01R 31/318536 | 714/726 |
| 2014/0006836 A1* | 1/2014 | Menon | G06F 1/12 | 713/400 |
| 2014/0101500 A1* | 4/2014 | Bastimane | G01R 31/318536 | 714/727 |
| 2014/0149812 A1* | 5/2014 | Tekumalla | G01R 31/318555 | 714/727 |
| 2015/0268293 A1* | 9/2015 | Bertacco | G01R 31/2601 | 702/109 |
| 2018/0004878 A1* | 1/2018 | Hutton | G06F 17/5031 | |

OTHER PUBLICATIONS

Hung et al., Speculative Debug Insertion for FPGAs, 2011, IEEE, pp. 524-531.*

Hung et al., Towards Simulator-like Observability for FPGAs: A Virtual Overlay Network for Trace-Buffers, Feb. 11-13, 2013, pp. 19-28.*

Hung, Harnessing FPGA Technology for Rapid Circuit Debug, Aug. 2013, The University of British Columbia (Vancouver), pp. ii-xv, 1-163.*

Keeley, An Incremental Trace-Based Debug System for Field-Programmable Gate-Arrays, Nov. 7, 2013, Department of Electrical and Computer Engineering Brigham Young University, pp. 1-63.*

Hung et al., "Accelerating FPGA Debug: Increasing Visibility Using a Runtime Reconfigurable Observation and Triggering Network", ACM Transactions on Design Automation of Electronic Systems, vol. 19, No. 2, Article 14, Mar. 2014, 24 Pages.

Vansteenkiste et al., "TPaR: Place and Route Tools for the Dynamic Reconfiguration of the FPGA's Interconnect Network", IEEE Transactions on Computer-Aided Design of Integrated Circuits and Systems, vol. 33, No. 3, Mar. 2014, 14 Pages.

International Search Report from PCT Application No. PCT/EP2015/062049, dated Dec. 14, 2015.

* cited by examiner

INTEGRATED CIRCUIT VERIFICATION USING PARAMETERIZED CONFIGURATION

FIELD OF THE INVENTION

The invention relates to the field of application specific integrated circuit (ASIC) verification and debugging by emulation of such circuit in a programmable logic device, as well as to the field of verification and debugging of a circuit implemented in a programmable logic device. More specifically it relates to a method and device for testing and verifying and/or for debugging a circuit design in a programmable logic device such as a field-programmable gate array (FPGA) or in an application specific integrated circuit (ASIC).

BACKGROUND OF THE INVENTION

Many electronic devices have at their core Application-Specific Integrated Circuits (ASICs), e.g. Integrated Circuits (IC) that are customized for a particular use. Verifying the correct operation within time-to-market constraints can be a challenge for ASIC design teams. For example, 35 to 45 percent of the total ASIC development effort may be spent on verification, and this fraction may continue to grow due to the constant increase of chip complexity. Moreover, debugging may consume about 60 percent of the total verification effort and may be the fastest growing component. For example, a large fraction of silicon IC re-spins may be at least partially due to functional errors and bugs inadvertently introduced at the register-transfer level (RTL) stage of the design process. Thus, comprehensive functional verification is the key to reduce development costs and to deliver a product on time. Embedded systems are becoming even more complex. Errors in the specification, the design and the implementation may be substantially unavoidable. Efficient verification tools for verifying designs are therefore important, and even more so for ASIC designs, where errors cannot be easily fixed. In addition, a late introduction of the product can invoke an important loss of revenues.

Thus, application specific integrated circuit (ASIC) verification and debugging has become a challenging and time consuming task in ASIC design, particularly because state of the art ASIC designs can be quite large and complex. Circuit designers may use software simulation, e.g. Mentor Graphics Model-Sim, to verify and debug circuits. This is extensively used because of its ease of use. For example, designers are able to view the behavior of any internal signal in the circuit and they can detect design errors, fix them and re-simulate. However, the inefficiency of software simulation and timing constraints can prohibit the debugging of complete systems through software simulation. Moreover, the complexity of integrated circuits continues to increase, consistent with Moore's Law. For a complex chip design, e.g. a computer central processing unit, software simulations may run a billion times slower than the intended silicon implementation.

Programmable logic devices (PLDs) can be used as building blocks in creating electronic circuit designs. A programmable logic device is a hardware component whose functionality can be configured. For example, Field Programmable Gate Arrays (FPGAs) are off-the-shelf integrated circuit PLDs that can be configured to implement any particular digital circuit design. In order to address challenges in ASIC verification and debugging, programmable logic devices such as FPGAs can be used to facilitate debugging. Of course, also designs that are being implemented on FPGAs from the beginning must be debugged. Implementing a logic design on a FPGA, e.g. implementing an abstract description of functionality defining a predetermined function when executing on the FPGA, may typically comprise the steps of synthesis, technology mapping, placement and routing. As for ASICs, the FPGA implementation can be performed entirely at design time, before the component is used. However, due to the inherent reconfigurability of static RAM-based FPGAs (SRAM-FPGAs), this implementation can also be performed on the fly, e.g. by run-time hardware generation. Unfortunately, state of the art methods for hardware generation can be computationally expensive, such that run-time hardware generation may not be feasible for most applications given realistic time constraints. Nevertheless, an FPGA emulation can bridge the gap between hardware prototyping and software simulation by providing an environment which is much closer to the device being simulated.

The simulation of complete circuit systems in an FPGA, referred to as FPGA emulation, allows early access to verification and test preparation for the FPGA before the final result of the design cycle for ICs, referred to as the tape-out phase. Compared to software simulation, FPGA emulation allows for simulated operating frequencies that are several orders of magnitude faster. Hence the designers can run more complex tests and achieve higher testing coverage.

However, FPGA emulation can suffer from a lack of on-chip signal observability and a lengthy recompilation cycle. Observability of the internal signals can be enhanced by instrumentation of the design, but only a limited amount of such instruments can be inserted due to resource constraints. Therefore, only a limited subset of signals can be monitored simultaneously. The monitored subset can be changed by a recompilation, but each instrument-compile-debug iteration can take multiple hours due to this time-consuming recompilation. This severely limits debug productivity and may result in a slow time-to-market.

It is known in the art to insert trace-buffer instrumentation if sufficient spare resources exist in the target FPGA after a version of the circuit is emulated in the FPGA. Such trace-buffer IP can be inserted but require additional area and therefor are limited in number as such additional area is not always available (large designs may use the entire FPGA area). Furthermore, in some FPGA architectures, hardened control logic exists inside RAM blocks to allow circular buffers to be implemented.

For example, specific tools known in the art, e.g. tailored to specific FPGA devices, can embed logic analyzer IP into the user-circuit during compilation. Such logic analyzer IP can for example comprise signal probes, trigger monitors, trace buffers and/or data offload logic. If erroneous behavior is observed, verification tools can be used to add instrumentation to the circuit. Afterwards, the designer may determine the number of signals to be observed and the size of the trace-buffers. The circuit is then recompiled and the error is reproduced. The designer can use the data in the trace-buffer to narrow down the cause of the failure. However, such approach as known in the art may have the disadvantage of requiring signal predetermination and full recompilation. Alternatively, incremental techniques may be known in the art in which internal signals are multiplexed to reserved I/O pin for external analysis. The designer may predetermine the subset of signals to be observed. However, in this approach signal predetermination is also required and run time flexibility via parameterized configuration is not provided.

Furthermore, device-neutral techniques exist in the art that can offer much of the same functionality as described above. Such techniques may for example enable the selection of a small subset of signals during debug-time for observation and triggering, by allowing the designer to pre-instrument a large set of interesting signals in the target FPGA prior to compilation. Run time flexibility may for example be increased by using a multiplexer network. However, this may have the disadvantage of requiring the selection of a set of signals for observation before any bugs are known is required. The solutions such as a multiplexer network also require a lot of extra resources on the FPGA, increasing the used area.

Methods as known in the art may operate primarily on the pre-mapping circuit. Therefore, such methods may instrument the original user circuit with trace-buffers and associated connections before place-and-routing the combined design. Some tools as known in the art may however support a limited amount of reconfiguration. Nevertheless, even though it may be possible to modify the trigger conditions during runtime, changing the signals under observation does require a lengthy FPGA recompilation, even with the more advanced techniques known in the art.

However, methods are known in the art which use a debugging workflow that may bridge the gap between simulation and emulation, bringing good visibility to FPGA-based debugging. Such methodology may use as basis for the observation network a Virtual Overlay Network, implemented in free resources. Spurious recompilations may be avoided by reconfiguring this network during debug-time. However, in typical realistic designs, few available resources are left for the Virtual Overlay Network and the Virtual Overlay Network thus typically may be too small. Thus, insertion of extra instrumentation in the free multiplexers can be impractical in FPGA emulation of a large ASIC design.

SUMMARY OF THE INVENTION

It is an object of embodiments of the present invention to provide good means and methods for debugging and verifying an FPGA design or an ASIC design implemented in a FPGA.

It is an advantage of embodiments of the present invention that a short debugging cycle can be achieved.

It is an advantage of embodiments of the present invention that a high degree of signal visibility can be achieved while debugging a hardware design or ASIC design emulation on a FPGA platform.

It is an advantage of embodiments of the present invention that a debugging methodology in accordance with embodiments can be integrated into a conventional debugging flow, called Debugging methodology, which is integrated in the general design tool flow, e.g. may not require a separate debugging tool flow.

It is an advantage of embodiments of the present invention that time efficient debugging turns can be achieved, resulting in a faster time-to-market.

It is an advantage of embodiments of the present invention that a small area overhead suffices for insertion of debugging instrumentation. It is an advantage of embodiments of the present invention that large designs can be efficiently debugged, even where few free resources are available, e.g. where substantially no free resources are available in the FPGA.

The above objective is accomplished by a method and device according to the present invention.

The present invention relates to a method for debugging a circuit design on a programmable logic device, the method comprising inserting multiplexers in an existing design at signal locations whose value should be observable in the debugging phase, where the selection bits of the multiplexers are parameters defining when a signal is observable and when not, compiling an enhanced integrated circuit design specification to a parameterized configuration specification for a programmable logic device, with the multiplexer selection bits as parameters, programming the programmable logic device in accordance with said parameterized configuration specification, said programming comprising adding a plurality of tunable connections to the parameterized configuration specification for routing a plurality of internal signals to at least one trace buffer, each tunable connection being adapted for routing exactly one internal signal of said plurality of internal signals to exactly one trace buffer of said at least one trace buffer when the tunable connection is set to an active state by a corresponding parameter, and debugging the programmable logic device while executing said parameterized configuration specification, wherein said debugging comprises reconfiguring the programmable logic device for selecting a subset of the plurality of internal signals to route to the at least one trace buffer, wherein this reconfiguring comprises applying a parameterized run-time reconfiguration of at least one routing configuration cell of the programmable logic device in accordance with said parameterized configuration specification.

Selecting a subset of the plurality of internal signals may comprise selecting a subset of multiplexer selection bits for selecting signals to be observable during the debugging.

According to embodiments of the present invention, the debugging functionality may advantageously be introduced in the design cycle at the same time as the circuit. According to some embodiments, the debugging functionality may be optimized at the same time as the circuit. For example, the amount of debugging functionality and the circuit design, such as for example layout and space, may be optimized together, i.e. taking both optimization conditions for the debugging functionality and the circuit design at the same time and together into account. By co-optimizing debugging functionality and the circuit design, a better debugging functionality and/or better circuit design (with more possibilities) can be obtained, compared to a situation where the debugging functionality would for example not be co-optimized but e.g. only be implemented thereafter. According to some embodiments, by co-optimizing the debugging functionality and the circuit design during the design cycle, more debugging functionality can be obtained for a same circuit space, since e.g. the layout can be optimized such that appropriate circuit design is obtained as well as large debugging functionality.

Such an optimization may be performed by defining a cost function for the debugging flexibility and the circuit design and optimizing the cost function (e.g. obtaining a minimal cost function). In this optimization, it may be guaranteed that at least a predetermined minimum debugging functionality and at least the required circuit flexibility is obtained. In some embodiments, by selecting for example another layout, for the same circuit functionality, a better debugging functionality can be obtained.

Embodiments of the present invention also provide a benefit in online monitoring and debugging. In some applications, debugging is not only done beforehand (at design time) but also continues during normal operation of the circuit (online monitoring and debugging) (e.g. this is important for ESA and in the automotive world to constantly check if the circuit still operates correctly). The current approach, wherein co-optimization can be performed, allows both design time and online debugging (where you keep the optimized debugging infrastructure together with the circuit implementation). It is an advantage of embodiments of the present invention that the debugging functionality may be optimized for speed, such that also in online debugging, the entire circuit can run at a high clock speed. In embodiments of the present invention, the debug clock is optimized together with the circuit clock and therefore the total speed (circuit+debugging) can be faster and even controllable upfront. The speed may be used as a cost function or as a parameter of a cost function.

It is an advantage of at least some embodiments, that it allows to switch between circuit mode and debug mode easily.

It is an advantage of at least some embodiments of the present invention that it allows to easily deal with high level debug infrastructure which is added to the circuit code (assertions). Since these are integrated within the circuit code, one can immediately implement these signals as "preferred" debug signals within the circuit design. This is another benefit from the implementation as described. The present invention also relates to a method for debugging a circuit design on a programmable logic device, the method comprising:

inserting multiplexers in an existing design specification at signal locations whose value should be selectively observable during debugging, where selection bits of the multiplexers are parameters defining when a signal is observable and when not, thus forming an enhanced integrated circuit design specification, compiling the enhanced integrated circuit design specification to a parameterized configuration specification for a programmable logic device, with the multiplexer selection bits as parameters, programming the programmable logic device in accordance with said parameterized configuration specification, and debugging the programmable logic device while executing said parameterized configuration specification, wherein said debugging comprises applying a parameterized run-time configuration of the programmable logic device in accordance with said parameterized configuration specification taking into account the selection bits of the multiplexers in accordance with signals to be observed during the debugging.

Said programming the programmable logic device may comprise an automatic generation of a parameterized configuration of the programmable logic device.

Said automatic generation may comprise the steps of synthesis, technology mapping, placement and routing.

Said compiling of the integrated circuit design specification to the parameterized configuration specification may comprise inserting multiplexers for routing internal signals to trace buffers.

The present invention also relates to a method for generating a test set of a circuit design on a programmable logic device, the method comprising inserting multiplexers in an existing design at signal locations where a fault can be generated, where selection bits of the multiplexers are parameters defining when a signal (fault) occurs and when not.

The present invention also relates to a method for generating a test set of a circuit design on a programmable logic, the method comprising:

inserting multiplexers in an existing design at signal locations where a fault can be generated, wherein selection bits of the multiplexers are parameters defining when a signal (fault) occurs and when not, thus forming an enhanced integrated circuit design specification, compiling an enhanced integrated circuit design specification to a parameterized configuration specification for a programmable logic device, with the multiplexer selection bits as parameters, programming the programmable logic device in accordance with said parameterized configuration specification, and testing the programmable logic device while executing said parameterized configuration specification, wherein said testing comprises applying a parameterized run-time configuration of the programmable logic device in accordance with said parameterized configuration specification taking into account the selection bits of the multiplexers in accordance with faults to occur for said testing.

Said compiling the integrated circuit design specification to the parameterized configuration specification may comprise injecting at least one parameterized fault in the parameterized configuration specification.

The method furthermore may comprise testing the programmable logic device while executing said parameterized configuration specification, wherein said testing comprises reconfiguring the programmable logic device for selecting a subset of the at least one parameterized fault.

Testing may comprise applying a Parameterized Test Pattern Generation procedure.

Applying the Parameterized Test Pattern Generation procedure may comprise selecting random tests.

As indicated above, in the different methods, the debugging functionality may advantageously be introduced in the design cycle at the same time as the circuit. According to some embodiments, the debugging functionality may be optimized at the same time and together with the circuit.

The present invention also relates to a debugging system for debugging a circuit design on a programmable logic device, the debugging system being configured for performing a method for debugging as described above.

The present invention also relates to a debugging system for debugging a circuit design on a programmable logic device, the debugging system comprising:

a circuit design component adapted for implementing a parameterized specification of a programmable logic device for a circuit design to be debugged, the parameterized specification comprising a plurality of tunable connections for routing a plurality of internal signals to at least one trace buffer, each tunable connection being adapted for routing exactly one internal signal of said plurality of internal signals to exactly one trace buffer of said at least one trace buffer when the tunable connection is set to an active state by a corresponding parameter, and a debugging component configured for debugging the programmable logic device while executing said parameterized configuration specification, wherein said debugging component is adapted for reconfiguring the programmable logic device for selecting a subset of the plurality of internal signals to route to the at least one trace buffer, wherein this reconfiguring comprises applying a parameterized run-time reconfiguration of at least one routing configuration cell of the programmable logic device in accordance with said parameterized configuration specification.

The circuit design component may be adapted for inserting multiplexers in an existing initial design specification at signal locations whose value should be selectively observable during debugging, where selection bits of the multiplexers are parameters defining when a signal is observable and when not, thus obtaining an enhanced integrated circuit design specification for said implementing a parameterized specification of the programmable logic device.

In some embodiments, the circuit design component may be adapted for co-optimizing the debugging functionality and the circuit during the design cycle. This co-optimization advantageously results in an optimum debugging functionality for a given circuit flexibility.

The debugging component furthermore may comprise an output means for outputting internal signals representative of the circuit design or its operation.

The debugging system furthermore may comprise a feedback component for reconfiguring the tunable connection based on the obtained internal signals.

The present invention also relates to a test set generation system for generating a test set of a circuit design on a programmable logic device, the test set generation system being configured for performing a method for test set generation as described above.

The present invention also relates to a test set generation system for generating a test set of a circuit design on a programmable logic device, the test set generation system comprising a circuit design component adapted for inserting multiplexers in an existing design at signal locations where a fault can be generated, where selection bits of the multiplexers are parameters defining when a signal (fault) occurs and when not.

In some embodiments, the circuit design component may be adapted for co-optimizing the debugging functionality and the circuit during the design cycle. This co-optimization advantageously results in an optimum debugging functionality for a given circuit flexibility.

The present invention furthermore relates to a computer program product for implementing a method as described above.

The computer program product furthermore may be adapted for integrating in a standard debug flow for a programmable logic device.

Particular and preferred aspects of the invention are set out in the accompanying independent and dependent claims. Features from the dependent claims may be combined with features of the independent claims and with features of other dependent claims as appropriate and not merely as explicitly set out in the claims.

These and other aspects of the invention will be apparent from and elucidated with reference to the embodiment(s) described hereinafter.

Figure 1:
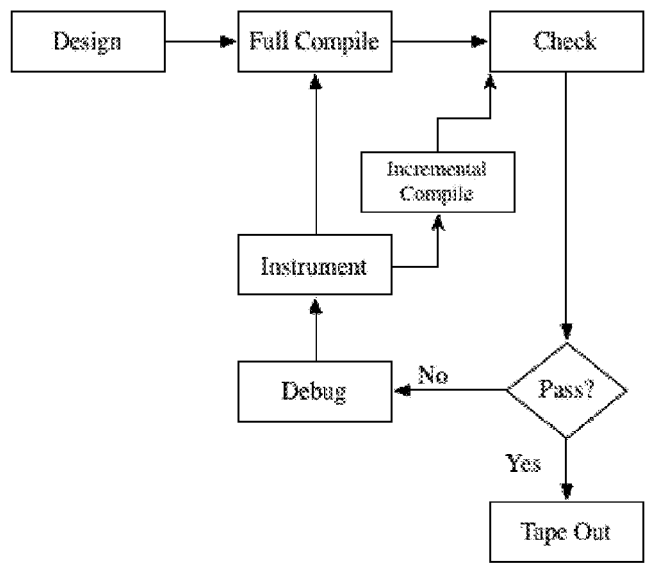
FIG. 1 illustrates a method for debugging according to prior art.

In the drawings, the size of some of the elements may be exaggerated and not drawn on scale for illustrative purposes.

Any reference signs in the claims shall not be construed as limiting the scope.

In the different drawings, the same reference signs refer to the same or analogous elements.

DETAILED DESCRIPTION OF ILLUSTRATIVE EMBODIMENTS

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the invention.

Furthermore, the terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

Moreover, the terms top, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly, it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

In the description provided herein, numerous specific details are set forth. However, it is understood that embodiments of the invention may be practiced without these specific details. In other instances, well-known methods, structures and techniques have not been shown in detail in order not to obscure an understanding of this description.

Where in embodiments of the present invention reference is made to "dynamic reconfiguration", reference is made to a reconfiguration of a programmable logic device, such as an FPGA device, which enables serial multiplexing of several functionalities; e.g. such that these are not used simultaneously. For example, the same FPGA area portion could be used for all these functionalities, because they are never needed at the same time. The FPGA area is simply reconfigured when a new functionality is needed. Dynamic reconfiguration can boost the area efficiency of FPGAs in certain applications.

Where in embodiments of the present invention reference is made to "dynamic circuit specialization" (DCS), reference is made to a technique for dynamically specializing an FPGA configuration according to the values of a set of parameters. The principle is described in U.S. Pat. No. 8,347,243. The general idea of DCS is that each time the parameter values change the device is reconfigured with a configuration that is specialized for the new parameter values. Since specialized configurations are smaller and faster than their generic counterparts, the system implementation will be more cost efficient. The main difficulty when building a DCS system is the fact that the specialized configurations need to be rapidly generated on the fly while providing a good quality in terms of size and speed.

Where in embodiments of the present invention reference is made to a "parameterized configuration", reference is made to an FPGA configuration bitstream for which some of the bits are expressed as Boolean functions of specific parameters. A parameterized configuration can be used to implement a DCS. For example, such parameterized configurations can be used to efficiently and quickly generate specialized configuration bitstreams by evaluating the Boolean functions. The specialized bitstreams may for example have slightly different properties and functionalities. Before the FPGA can be configured, the parameter values are used to evaluate the Boolean functions. This generates the specialized configuration. A parameterized configuration may be generated starting from a register transfer level (RTL) description of the functionality to be implemented, wherein low speed, infrequently varying signals are annotated as parameters. This description may be referred to as a parameterized HDL description.

Figure 2:
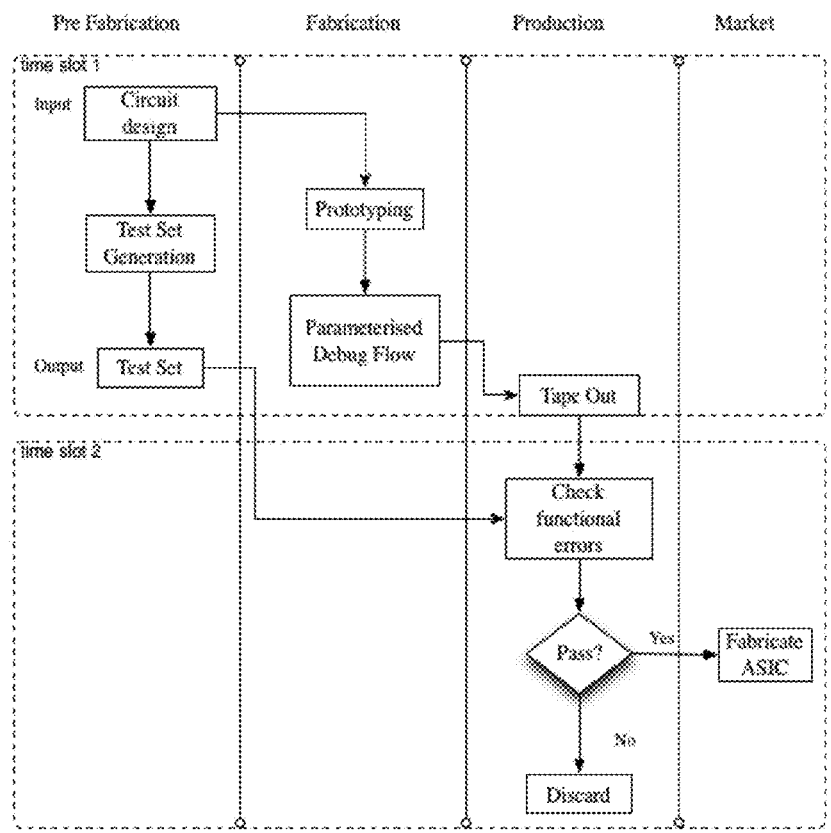
FIG. 2 illustrates the proposed combination of the test set generation, debugging and testing tool flows, as can be obtained using embodiments of the present invention.

FIG. 1 illustrates a method of a conventional debugging flow, shown for reason of comparison. Furthermore, in FIG. 2 an illustration of a method for FPGA/ASIC testing and verification as well as debugging is shown.

In order to allow the changing of the observed signals in an FPGA during a debugging cycle without requiring the circuit to be re-instrumented and recompiled, parameterized configurations are introduced into the debug cycle of ASICs in accordance with embodiments of the present invention. Thus, these parameterized configurations may be adapted for changing the subset of observed signals without requiring a complete recompilation.

In a first aspect, the present invention relates to a method, e.g. a computer implemented method, for debugging a circuit design on a programmable logic device.

Figure 3:
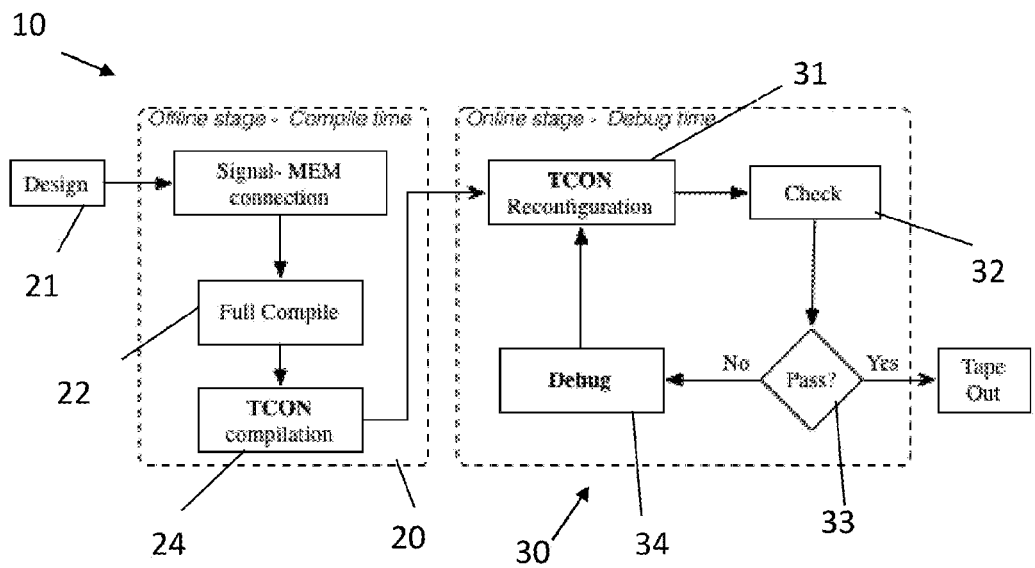
FIG. 3 illustrates a method for debugging according to embodiments of the present invention.

Referring to FIG. 3, a method 10 according to embodiments of the present invention is shown. For example, the circuit design may relate to a high level or low level description of an integrated circuit design, e.g. an ASIC design, being verified and/or debugged on a programmable logic device, such as a field-programmable gate array. The programmable logic device may relate to a dynamically reconfigurable device in particular, such as an SRAM-FPGA.

The method 10 comprises an offline stage, performed at compile time, and an online state, performed at debug time. The method comprises the step of compiling 20 an integrated circuit design specification to a parameterized configuration specification, e.g. a parameterized configuration specification for a programmable logic device. Compiling 20 may comprise designing 21 and/or simulating the integrated circuit design specification, e.g. in accordance with circuit design and software logic simulation techniques known in the art. The integrated circuit design specification may for example be a specification provided in VHDL or Verilog.

Compiling 20 the integrated circuit design specification may comprise obtaining a register-transfer level hardware description language specification of the integrated circuit design directly, e.g. receiving such specification as input, or may comprise fully compiling 22 a register-transfer level HDL specification from a high-level language specification, e.g. an algorithmic specification. The parameterized configuration specification may comprise a Boolean function definition and a set of parameters which is a subset of the function's arguments. The parameterized configuration specification may comprise a programmable logic device configuration in which some of the configuration bits are expressed as a function of the set of parameters. Thus, online specialization can be achieved by evaluating this function.

An internal signal of the plurality of internal signals may be connected to exactly one trace buffer of the at least one trance buffers. Connecting these signals to the trace buffers (signal-memory connection) is a routing approach. In the design's debug cycle, the only aspects of the FPGA that have to be reconfigured are the routing resources and specifically, only the configuration cells for all the multiplexers in the routing switch-boxes and the connection-boxes. In such method, the routing configuration bits of the FPGA are expressed as a function of the parameters, allowing reconfiguration of the interconnections. The latter may be implemented in one example via a virtual overlay network which provides a plurality of net connections, e.g. nets, each providing an interconnection having one source, e.g. a signal to be observed, and multiple sinks, e.g. a plurality of trace buffers.

According to some embodiments, the method may comprise introducing in the design cycle at the same time the debugging functionality and the circuit design. According to some embodiments, the debugging functionality may be optimized at the same time as the circuit. For example, the amount of debugging functionality and the circuit design, such as for example layout and space, may be optimized together, i.e. taking both optimization conditions for the debugging functionality and the circuit design at the same time and together into account. Alternatively or in addition thereto also the speed of the debugging and the circuit may be optimized and/or the layout can be optimized, resulting in the possibility for reaching a higher debugging functionality for a given circuit flexibility or more circuit flexibility for a given debugging functionality.

The method 10 further comprises programming 24 the programmable logic device in accordance with the parameterized configuration specification. This programming 24 comprising adding a plurality of tunable connections to the parameterized configuration specification for routing a plurality of internal signals to at least one trace buffer. Each tunable connection is adapted for routing exactly one internal signal of the plurality of internal signals to exactly one trace buffer of the at least one trace buffer when the tunable connection is set to an active state by a corresponding parameter. Thus, each tunable connection may correspond to a one-to-one logic block connector which can be switched in an on or off state via a selector parameter. By controlling the tunable connections, e.g. by selecting appropriate parameters and reconfiguring the device during runtime, the user may select internal signals to be traced during runtime. Therefore, where the available resources may not be sufficient to provide a virtual overlay network with good coverage of the signals to be observed without circuit specialization, a parameterized configuration of the device may allow fast and easy reconfiguration of the routing resources to obtain a good coverage. Thus, the plurality of internal signals may comprise all available internal signals defined by the register-transfer level HDL specification or a subset of all available internal signals, for example a large subset selected by the designer. The at least one trace buffer may be a limited number of trace-buffer resources, e.g. scarce trace buffers formed by resources left unused by integrated circuit design specification.

Figure 4:
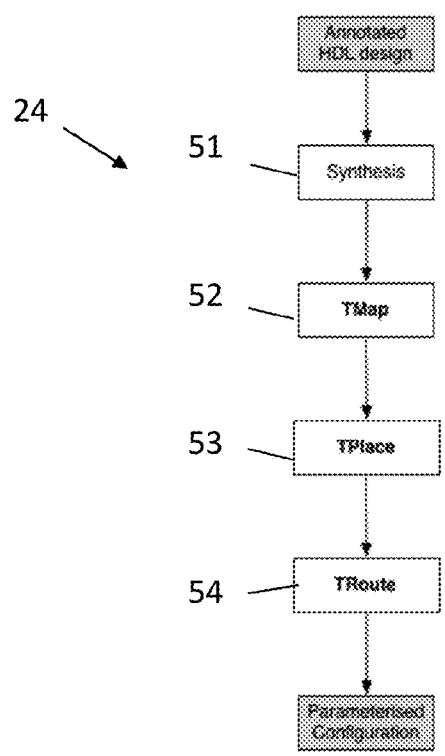
FIG. 4 shows a tool flow for programming a device in accordance with a parameterized configuration specification in a method according to embodiments of the present invention.

Programming 24 the programmable logic device in accordance with the parameterized configuration specification may comprise an automatic generation of a parameterized configuration, e.g. a configuration bitstream for the programmable logic device, from the parameterized configuration specification, e.g. a parameterized HDL description. Such automatic generation may comprise steps as known in conventional FPGA tool flows: synthesis 51, technology mapping 52, placement 53 and routing 54. Details on the programming 24 in accordance with embodiments of the present invention may for example be found in international patent application WO 2009/138490. The above is described with reference to FIG. 4.

Figure 5:
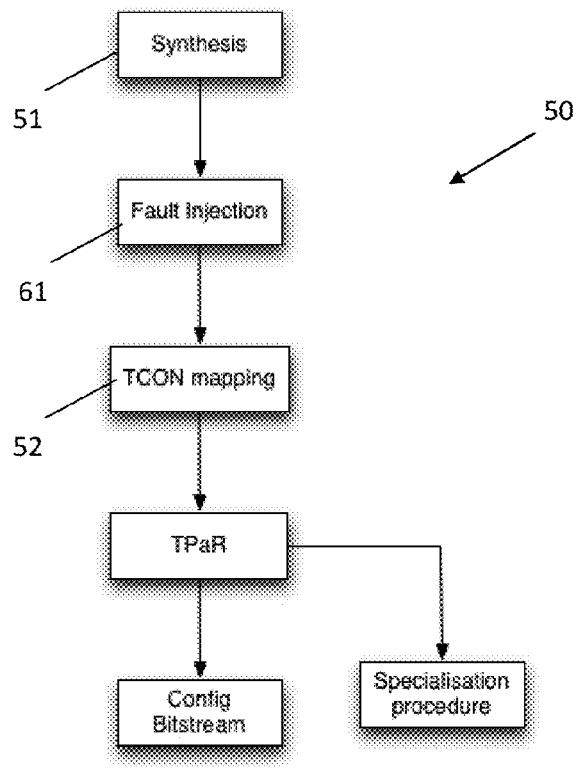
FIG. 5 illustrates the offline stage of a test set generation method according to an embodiment of the present invention.

For example, the synthesis 51 may generate a parameterized Boolean network, and the technology mapping 52 may map the parameterized Boolean network on abstract primitives that represent parameterized versions of the resource primitives available in the target device architecture. For example, a Tuneable LookUp Table (TLUT) is a parameterized abstraction of a LUT. The truth table bits are expressed as functions of parameter inputs. Since parts of the design functionality depending on the parameters are incorporated in truth table bits of the TLUTs, the size of the TLUT circuit is much smaller than the regular LUT circuit for the same design. Therefore, a TLUT is a LookUp Table with the truth table expressed in terms of parameters. A TLUT can be implemented by a regular LUT and the dynamic reconfiguration of its truth table. A Tuneable Connection (TCON), another abstract concept which may be generated in the technology mapping step, is a connection with connection condition expressed in terms of parameters. A TCON may be implemented by a set of wires and switches, and the dynamic reconfiguration of some of the switches in the set. A schematic of a TCON can be found in FIG. 4. Comparable to a regular connection, a TCON has a source and a sink. Not all connections are needed at the same time and each TCON has a connection condition that reflects this fact. The connection condition is defined as $\zeta(p): B^\kappa \to B$, with $\kappa$ the number of parameters. It is a Boolean function of the parameters that when the design requires the connection to be active the connection condition returns true. These connections are also allowed to share FPGA routing resources. Another example of an abstract primitive is a TLC: one TLUT with TCONs attached to its inputs, as shown in FIG. 5.

The technology mapping 52 may exploit both the reconfigurable properties of the lookup tables (LUTs) and of the interconnect network in an FPGA device. The technology mapping may be referred to as a TCONMap algorithm. TCONMap may for example be used to perform technology mapping after providing parameterized routing infrastructure for tracing internal signals and/or after parameterized fault injection in accordance with embodiments of the present invention.

The method 10 further comprises debugging 30 the programmable logic device while executing the parameterized configuration specification. Such debugging may comprise a conventional debugging loop, e.g. comprising a testing step 32, evaluating a pass criterion 33 and an automatic, guided or manual new signal selection for observation when the pass criterion is not satisfied. The debugging comprises reconfiguring 31 the programmable logic device for selecting a subset of the plurality of internal signals to route to the at least one trace buffer, in which this reconfiguring comprises applying a parameterized run-time reconfiguration of at least one routing configuration cell of the programmable logic device in accordance with the parameterized configuration specification.

For example, before debugging the designer may select a subset of signals to be multiplexed into the trace buffers and a parameterized configuration is created for this design. Now, each time the designer wants to change the signals under observation, the appropriate parameter values are selected and a new specialized configuration is generated using the Parameterized Configuration. Once this new configuration is loaded into the FPGA, the observed signals have changed and the emulation can be restarted. Thus, only reconfiguration is needed at debug time and the time consuming recompilation step is avoided. Because reconfiguring even an entire FPGA can be very fast, e.g. tens of milliseconds, the debug-cycle can be sped up significantly.

With the use of Parameterized Configurations, one of the major disadvantages of FPGA emulation, limited visibility, can be improved, bringing it closer to the full visibility provided by software simulation. An additional advantage of Parameterized Configurations is that it allows the use of the routing infrastructure of the FPGA to implement the instruments, thus reducing their overhead. Instead of implementing multiplexers that select the observed signals by lookup tables, multiplexers may be implemented in accordance with embodiments of the present invention by the reconfiguration of the routing infrastructure.

Designers can choose to insert trace instrumentation to enhance on-chip observability. Where prior art methods may require recompiling the entire design for each new trace configuration, the use of DCS in accordance with embodiments of the present invention can offer an automatic method where no reimplementation and recompilation of the entire design is anymore needed.

In some embodiments, a virtual overlay network may be used. The virtual overlay network may use only the FPGA resources that were left over from the initial mapping, but the resources in the prototypes of modern ASIC designs are scarce. If the FPGA runs out of resources, the obvious solution in a conventional debug flow would be to use several FPGAs. However, the run-time parameterized reconfiguration of routing resources in accordance with embodiments of the present invention may provide a simpler, faster and cheaper alternative. The routing problem may be defined as connecting a large number of internal signals to at least one trace buffer. In the design's debug cycle, the only aspects of the FPGA that have to be reconfigured are the routing resources and specifically, only the configuration cells for all the multiplexers in the routing switch-boxes and the connection-boxes. A tunable connection (TCON) is an abstraction of a subset of an FPGA's routing resources, which reflects the reconfigurability of those resources. Thus, using the TCON, extra resources may be considered hidden in the wiring.

More specifically, before debugging, a large subset of signals may be selected to be multiplexed into the trace buffers and a parameterized configuration is created for this design. Now, each time the designer wants to change the signals under observation, appropriate parameter values are selected and a new specialized configuration is generated using the Parameterized Configuration. Once this new configuration is loaded into the FPGA, the observed signals have changed and the emulation can be restarted. Thus, only reconfiguration is needed at debug time and the time consuming recompilation step is avoided. Because reconfiguring even a complete FPGA can be very fast, e.g. tens of milliseconds, the debug-cycle can be speed up significantly. With the use of Parameterized Configurations, one of the major disadvantages of FPGA emulation, limited visibility, will be improved, bringing it closer to the full visibility provided by simulation. An additional advantage of Parameterized Configurations is that it allows the use of the routing infrastructure of the FPGA to implement the instruments, thus reducing their overhead.

While methods may exist in the art that enable the reconfiguration of the observed signals by setting configuration bits, e.g. selecting the observed signals by lookup tables, in embodiments of the present invention, multiplexers may be implemented by the reconfiguration of the routing infrastructure. Thus, a larger set of signals may be selectable for observation, by inserting trace buffers with a minimal area overhead and at the same eliminating FPGA recompilations.

Embodiments according to the present invention may implement, or form part of, an efficient instrument-compile-debug cycle. In particular, embodiments of the present invention may enable the partial reconfiguration of a design during runtime without requiring extensive recompilation. During debug time, when a new subset of signals needs to be observed, in a system as known in the art, an FPGA recompilation may be necessary, which can take several hours to be executed. However, in accordance with embodiments of the present invention, an efficient reconfiguration enables a new set of signals to be observed without a new recompilation cycle. Furthermore, this reconfiguration may for example be executed in a few seconds. Hence, each debug turn may have its time efficiency increased.

Embodiments of the present invention may also offer full signal visibility. For example, multiple signals may be multiplexed into a single trace buffer. Even though a limited window of signals can be observed simultaneously, fast reconfiguration can constantly enable new subset of signals to be observed, such that full on-chip visibility, e.g. similar to the high degree of signal observability available in software simulation systems, may be achieved in practice. The signals may be multiplexed in the routing resources of the FPGA such as to allow a rapid parameterized reconfiguration of those resources during debug-time, e.g. providing in a few seconds a new set of signals for tracing and triggering, while other approaches known in the art may require multiple hours for such reconfiguration.

In embodiments according to the present invention, a network may multiplex multiple internal signals to a scarce set of FPGA trace buffers. This multiplexing may be executed by using only the FPGA resources that are left over from an initial mapping. Since these available resources in modern ASIC design prototypes may be scarce, a parameterized run time reconfiguration of the FPGA routing resources may significantly increase the number of signals that can be traced.

In a second aspect, the present invention relates to a process related to debugging that can delay time-to-market being the test set generation for testing. It is a small but time consuming part of the Verification and Testing process. Test set generation is an important step that ensures that the physical device, manufactured from the synthesized design, has no manufacturing defects. While verification is a predictive analysis to ensure that the synthesized design will perform the given functionality, testing verifies the correctness of hardware and includes Test Set Generation which allows easy verification on every manufactured device. Conventionally, the test set generation may be derived by fault simulation, which is applied throughout the entire test pattern generation cycle. However, it can also be done on an FPGA during debugging.

FPGA fault injection techniques known in the art can be divided into two basic categories: reconfiguration based or instrumentation based. Reconfiguration based techniques change the configuration bits of the FPGA device using full or partial reconfiguration in such a way that a fault model is applied on the desired fault site. These techniques, can add errors directly to the bitstream and it is necessary to generate a new bitstream for each new fault. Hence, in these techniques, the reconfiguration process is the speed bottleneck. In the instrumentation-based techniques, fault injection circuitry is added to a possible fault site, called a checkpoint.

Thus, faults are injected in every fault site. These techniques offer higher speed-up than reconfiguration-based techniques, but the injection of the extra circuitry results in an area bottleneck, since they add extra hardware.

It is known in the art to implement Fault Emulation by a combination of Fault Injection software and Input Pattern generators. The Fault Insertion software adds logic in the circuit to emulate faulty behavior, such as single stuck-at-faults. The test pattern generation is used to quickly find which test pattern is best suited to find the injected fault.

Figure 6:
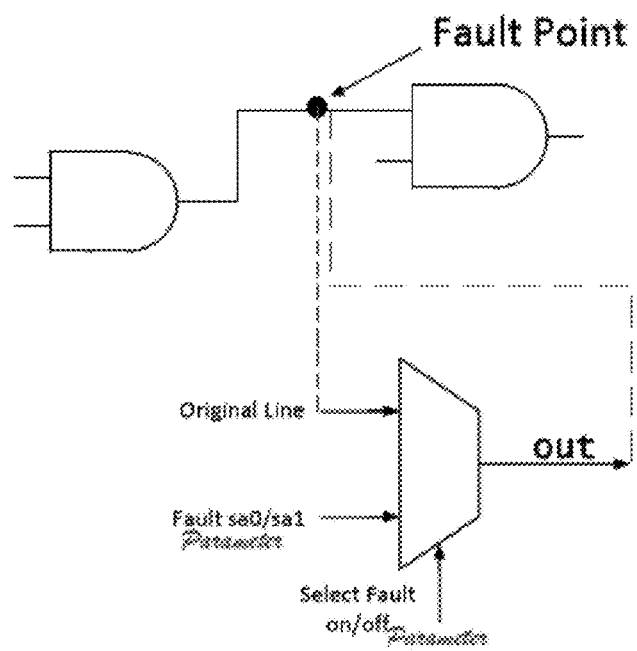
FIG. 6 illustrates the injection of a parameterized fault in a parameterized configuration specification according to embodiments of the present invention.
Figure 7:
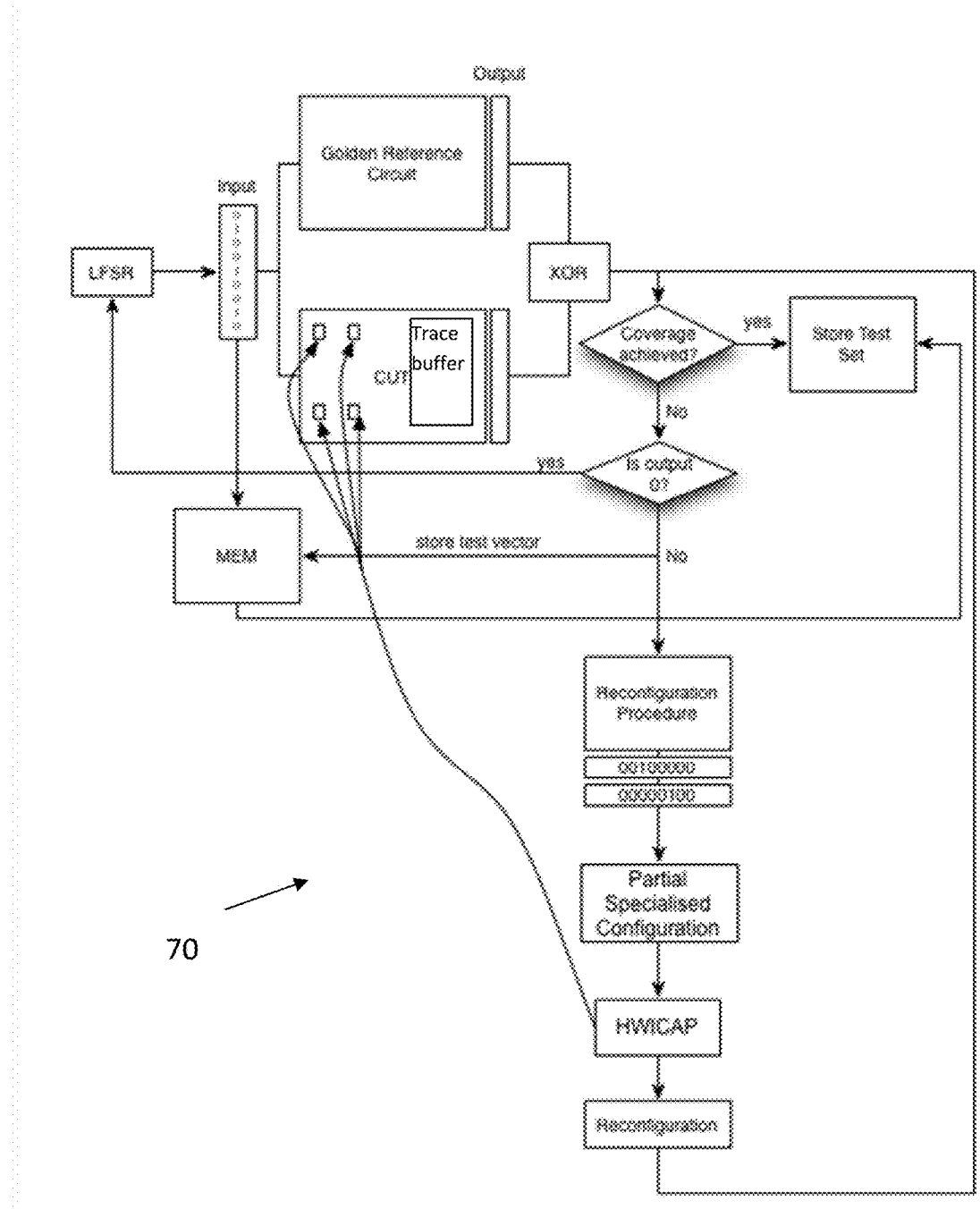
FIG. 7 describe the offline and the online tool for test set generation, according to an embodiment of the present invention.

FIGS. 5 and 7 illustrate respectively the offline and online stage of an exemplary method according to embodiments of the present invention, in which the step of compiling 50 an integrated circuit design specification to a parameterized configuration specification for a programmable logic device, comprises injecting 61 at least one parameterized fault in the parameterized configuration specification, wherein injecting each at least one parameterized fault may comprise the injection of a multiplexer at a fault location, in which the selection signal of the multiplexer corresponds to a parameter of the parameterized configuration specification. Thus, each fault site can be controlled by reconfiguration while simultaneously keeping the area overhead minimal. The injection of a parameterized fault is illustrated in FIG. 6.

During the testing flow illustrated in FIG. 5 the selected fault injection model may be applied by adding a virtual multiplexer network. However, the resources in the prototypes of modern ASIC designs can be scarce. If the FPGA runs out of resources the obvious solution in a conventional testing flow is to use several FPGAs. In such case the tunable connections approach may be used in accordance with embodiments of the present invention for run time reconfiguration of FPGAs routing resources. Since building the virtual multiplexer network is a routing problem, in the design testing cycle the only aspects of the FPGA that have to be reconfigured are the routing resources and specifically, only the configuration cells for all the multiplexers in the routing switch-boxes and the connection-boxes. A TCON is an abstraction of a subset of an FPGAs routing resources, which reflects the reconfigurability of those resources.

A method according to embodiments may comprise testing 70 the programmable logic device while executing the parameterized configuration specification. The latter is shown in FIG. 7. It is known in the art to apply an Automatic Test Pattern Generation (ATPG) to the Circuit Under Test (CUT) with a specific fault model, in order to find a test set that detects all possible faults in the circuit. This can be used to find a test sequence that enables automatic test equipment to distinguish between correct and faulty circuit behaviour. The effectiveness of an ATPG can be measured by the coverage, being the ratio $n_{df}/(n_{tf}-n_{rf})$, where $n_{df}$ is the number of detected faults, $n_{tf}$ is the number of total faults and nif is the number of redundant faults.

In order to check if the test set is capable of detecting a fault, the outputs of the CUT and of the initial fault free version defined as golden reference circuit, may be compared under the same input stimulus. If the outputs differ, the fault is detected and the test vector that detected it is stored in the final test set. The process repeats for each single stuck-at fault. Thereby, when a specific level of fault coverage is achieved, the ATPG terminates resulting to the test set.

The testing 70 may comprise a Parameterized Test Pattern Generation (PTPG) flow, e.g. similar to an Automatic Test Pattern Generation procedure. The ATPG may produce the input patterns needed to identify all faults by using test set generation, and may find a test set efficiently. Both the circuit under test and the fault inserted version of the original circuit can be implemented together on the FPGA by different parameter choices of the parameterized configuration. The area overhead can be reduced and the time consuming full reconfiguration of the FPGA can be avoided by a method according to embodiments of the present invention.

Parameterized Configurations may be used via the TCON tool flow, as described above. After the fault injection, the output may for example be a BLIF file with parameterized faults inserted in all possible fault locations. Then, this CUT is used as an input for mapping with the parameterized configurations tool flow, e.g. TCONMap. The parameterized configurations technique can minimize the area needed by reducing the number of LUTs of the injected circuitry and can introduce TCONs as well. Thereby the circuit is able to fit into the target FPGA and the technique can also be used for larger circuits. Thus, it can be used to expedite the generation of the input patterns for testing the integrated circuits.

Applying the Parameterized Test Pattern Generation procedure may comprise selecting random tests. This approach provides the advantage of providing a fast test set generation cycle, which is easy to design. Also, it is faster to generate random test inputs and select a viable test by emulation, then to effectively search for a test that detects the fault. For example, a Linear Feedback Shift Register (LFSR) may be used to generate pseudo-random inputs, as it is impractical to test all possible inputs. LFSR may create repeatedly new vectors to be tested in the fault emulation circuitry and may be applied simultaneously with the deterministic testing algorithm in order to detect a fault.

The initial circuit and the CUT may be compared for every different input. If a fault is detected it keeps logs so that the appropriate test can be generated. As an output correctness analysis a XOR gate may be used, because it is easy to implement in hardware. The possible outputs of the golden reference circuit and the CUT may be XORed and if the output is 0 then the fault is detected and the vector generated by the LFSR is stored.

Taking into consideration that the parameters have to be infrequently changing inputs during the emulation and that one may want to use parameters for different faults, faults may be changed only after all tests related to that fault are done. As we each parameterized fault may have been assigned a different IDs for identifying each checkpoint, the fault emulator may activate one fault each time, which is consistent with the single stuck-at fault concept. Afterwards, a generic VHDL module may start creating inputs for the golden reference circuit and the CUT. The number of inputs that have to be generated until a certain level of fault coverage is achieved, can vary. The number of the generated test vectors can be increased up to a certain point. At this point, the maximum fault coverage is achieved, and most of the faults are detected. After this point, there is minimal increase in the test size as well. Hence, if the outputs differ given the same input, an output correctness analysis circuitry may detect the difference and therefore the input vector is stored for further use and the FPGA is reconfigured with a different parameterized configuration in order to activate a different fault location. A pseudo-code for the algorithm may be as below:

Algorithm 1: Finds the parameterized test set generator
Input: CUT and golden reference circuit
Output: The Parameterized Test Set
1 for each fault F do
2 Call Reconfiguration Procedure with F;
3 initiate LFSR;

4 while outputs equal do
5 proceed LFSR to next bit vector;
6 apply test vector from LFSR;
7 log input test vector;
8 return test sequence;

The testing 70 may comprise reconfiguring the programmable logic device for selecting a subset of the at least one parameterized fault.

In embodiments according to the present invention, the injecting of the at least one parameterized fault may be performed before technology mapping on a synthesized object, e.g. on a BLIF gate-level logic representation of the integrated circuit design specification. Thus, resynthesis of the design can be avoided, such that fault injection can be performed in a fast and efficient manner.

Injecting the at least one parameterized fault may emulate stuck-at-fault behaviour. It is an advantage of embodiments of the present invention that a simple algorithm may be used for generating the fault injected circuitry without requiring deep knowledge of the hardware of the FPGA platform. The fault injection tool may be applied to a fault injected circuit in order to produce tunable lookup tables (TLUTs).

Embodiments of the present invention may provide a pre-mapping fault injection technique without requiring user intervention in the FPGA's configuration.

Embodiments of the present invention may provide efficient test set generation through fault emulation. The parameterized configurations concept can also be used to reduce the area overhead of fault emulation and allow fast test vector generation through reconfiguration. Both the original circuit and a fault injected version of the same circuit may be emulated together on the FPGA. Parameterized configurations may be used to rapidly change the location of the faults in the circuit, which allows a fast generation of the test sets.

During compilation, e.g. during the offline stage of a method according to embodiments of the present invention, the area overhead of the circuit can be reduced, e.g. minimized, by annotating the hardware that was left unused by the initial design specification as parameters. Then, technology mapping based on the parameterized configurations tool flow may be applied. During technology mapping, as discussed hereinabove, the parameterized Boolean network generated by the synthesis step is not mapped onto the resource primitives available in the target FPGA architecture, but on abstract primitives that represent parameterized versions of these resource primitives. Afterwards, during the debugging 30, e.g. during the online stage, a parameterized reconfiguration may be applied to select a useful specialization of the annotated hardware.

In a third aspect, the present invention relates to a computer program product for implementing a method according to the first aspect and/or a method according to the second aspect of the present invention, for example, for performing steps of such method when executing the computer program product, e.g. a computer software, on a computing platform. The computer program product is furthermore adapted for integrating in a standard debug flow for a programmable logic device, e.g. for integrating in a standard automation product as known in the field.

In one particular aspect, the present invention relates to a debugging system for debugging a circuit design on a programmable logic device. Such a debugging system typically is a design tool for designing specific circuits. The debugging system may be a system adapted for performing a method as described above. It may be implemented in software as well as hardware. In one particular set of embodiments, it comprises a circuit design component adapted for implementing a parameterized specification of a programmable logic device for a circuit design to be debugged, the parameterized specification comprising a plurality of tunable connections for routing a plurality of internal signals to at least one trace buffer, each tunable connection being adapted for routing exactly one internal signal of said plurality of internal signals to exactly one trace buffer of said at least one trace buffer when the tunable connection is set to an active state by a corresponding parameter. In these embodiments, it also comprises a debugging component configured for debugging the programmable logic device while executing said parameterized configuration specification, wherein said debugging component is adapted for reconfiguring the programmable logic device for selecting a subset of the plurality of internal signals to route to the at least one trace buffer, wherein this reconfiguring comprises applying a parameterized run-time reconfiguration of at least one routing configuration cell of the programmable logic device in accordance with said parameterized configuration specification. In some embodiments, an output means may be provided for outputting internal signals representative of the circuit design or its operation. In some other particular embodiments, a feedback component, e.g. a feedback loop, may be present for providing feedback in the debugging system, e.g. it may be adapted for reconfiguring the tunable connection based on the obtained internal signals. Such a reconfiguration may be such that the monitoring of specific internal signals is triggered, e.g. based on certain results obtained for previously monitored internal signals. The selection of the internal signals to be monitored may be performed based on a look up table, a predetermined algorithm, an algorithm based on a neural network, etc.

In another particular aspect, the present invention relates to a test set generation system for generating a test set of a circuit design on a programmable logic device. Such a test set generation system typically is a design tool for designing specific circuits. The test set generation system may be a system configured for performing a test set generation method as describe above or a testing/verification method as described above. It may be implemented in software as well as hardware. In one particular set of embodiments, it comprises a circuit design component adapted for implementing a parameterized specification of a programmable logic device for a circuit design to be tested, the design having multiplexers inserted in an existing design at signal locations where a fault can be generated, where selection bits of the multiplexers are parameters defining when a signal (fault) occurs and when not. In some other particular embodiments, a feedback component, e.g. a feedback loop, may be present for providing feedback in the testing, e.g. it may be adapted for reconfiguring the tunable connections, i.e. select the selection bits, based on the obtained results. Specific features of the test set generation system or a test system using such a test set generation system may correspond with features having the functionality of standard and/or optional steps of the method for test set generation or testing as described above.

By way of example, a particular implementation of an offline stage as illustrated in FIG. 5, is described in more detail below, illustrating standard and optional features of embodiments of the present invention.

The offline stage as shown in FIG. 5 may comprise the following steps:

Synthesis: In the synthesis step the HDL code is translated from a human readable form to a gate-level logic circuit.

Since one has already available the synthesized initial design (golden reference circuit) one can inject directly faults at this level, after synthesis, where the design can be expressed in Berkeley Logic Interface (BLIF) format. This format can describe a logic-level hierarchical circuit in textual form. So the design can be synthesized with any of the conventional tools that can produce BLIF files and the design originally can be described in various HDLs, such as VHDL/Verilog. No changes are needed in the synthesis step. Normally, during the TCON and TLUT tool flow some minor changes are necessary, as HDL parameter annotation. However, since already synthesized BLIF files are used, the synthesis step can be performed by any tool that is able to extract the BLIF format. At this point the design is ready for fault injection.

Fault Injection: in the embodiments of the present invention where test set generation is performed, it is assumed that the injected fault set is either optimized, or it can be optimized by existing techniques such as fault dropping and fault collapsing. The single stuck-at fault is used as it is a widely applied and easy-to-implement method in order to introduce faulty behaviour in the circuit. These stuck-at faults, have to be added into the design at every possible fault location in such a way that after the new modifications, the new description remains synthesizable.

The solution is to add multiplexers into each fault point to introduce a logic one or zero in order to mimic a stuck-at fault, as it is shown in FIG. 6. Next, focus is put on the details of how to insert the MUXes in the synthesized design. So, in order to insert faults in the netlist, before the mapping step, our tool reads the netlist and locates all the possible fault checkpoints; locations where faults need to be inserted. When a possible fault location is found, the algorithm adds a multiplexer as shown in FIG. 6. The selection signal and the stuck-at fault signal are annotated as parameters, as they will change depending on the type of fault and whether or not the fault should be injected. In order to keep specialization overhead under control and apply test set generation further optimizations are needed.

First, by introducing faults directly in the BLIF format one minimizes the computation runtime of the offline stage, as the design needs to be synthesized only once and it is avoided to design resynthesis for every new fault. Then, the selection signals of the multiplexers are used as a parameter. Thus, each one of the potential fault sites can be activated by the tool via rapid reconfiguration. At this point the design is ready for technology mapping. Next, one can apply the PConf concept during technology mapping. This approach focuses mainly on changes in the technology mapping step and how it addresses the area overhead in the routing.

TCON mapping: When injecting faults in the BLIF file, the tool will annotate as parameters the selection bits of the multiplexers. There is a focus on observing and controlling all the different possible faults. Whereas the traditional FPGA-based fault emulation methods still suffer from specialization overhead, the PConf concept is used, to reduce the area overhead of fault emulation and to allow fast test vector generation through reconfiguration. During technology mapping, the parameterized Boolean network generated by the synthesis step is not directly mapped onto the resource primitives available in the target FPGA architecture, but intermediately on abstract primitives that represent parameterized versions of these resource primitives:

A Tuneable LookUp Table (TLUT) is implemented by a regular LUT and the dynamic reconfiguration of its truth table. It is a parameterized abstraction of a LUT expressed as functions of parameter inputs. Generally, when we use TLUTs, parts of the design functionality depending on the parameters are incorporated in truth table bits of the TLUTs, thus the size of the TLUT circuit is much smaller than the regular circuit for the same design. In the approach according to embodiments of the present invention, logic (multiplexers) is basically added without adding more LUTs because they are depending on only parameters. So basically, the same size is present as for the original circuit but now for an extended circuit with injected faults.

A Tuneable Connection (TCON) is an abstraction of a connection with a connection condition expressed in terms of parameters. A TCON is implemented by a set of wires and switches, and the dynamic reconfiguration of some of the switches in the set. Comparable to a regular connection, a TCON has a source and a sink, not all connections are needed at the same time and each TCON has a connection condition that reflects this fact. The connection condition is defined as a Boolean function of the parameters that indicates when the design requires the connection to be active and thus when the connection condition returns true. Connections with mutually exclusive connection conditions are never active at the same time and therefore are also allowed to share FPGA routing resources.

TCONMap produces a tuneable circuit, which contains TLUTs and TCONs. TCONMap is able to exploit both the reconfigurable properties of the LUTs and the interconnect network of the FPGA. TCONMap is used in order to apply technology mapping after we performed parameterized fault injection.

During the proposed testing flow, the goal is to apply the selected fault injection model by adding a virtual multiplexer network. However, the resources in the prototypes of modern ASIC designs are scarce. If the FPGA runs out of resources the obvious solution in a conventional testing flow is to use several FPGAs. The TCON tool is used and more specifically the run time reconfiguration of FPGAs routing resources. Since building the virtual multiplexer network is a routing problem, in the design testing cycle the only aspects of the FPGA that have to be reconfigured are the routing resources and specifically, only the configuration cells for all the multiplexers in the routing switch-boxes and the connection-boxes TPaR: Next, the Tunable Place and Route tool (TPAR) places and routes the TCON netlist of a TCON implementation and performs packing, placement and routing with the algorithms TPack, TPlace and TRoute. In the packing step, LUTs and FFs are packed into CLBs and the placer choses a physical CLB on the FPGA for every instance of the CLB primitive in the circuit. This step has significant changes compared to the conventional packing, placement and routing. Alterations were made to be able to deal with tuneable circuits. Then, during the TRoute step, routing resources are assigned to the TCONs. The TPoute has to deal with tunable circuits with TCONs as well, and the interconnection pattern is now dependent upon the value of the parameters. That is why TPaR outputs a Boolean function of the parameters. These algorithms can enable routing of tuneable circuits and the routing resources can be reused during the fault emulation and drastically reduce the area usage.

Parameterized Bitstreams: Finally, at the end of this computational intensive offline stage the tool flow creates a PConf, a virtual intermediate FPGA configuration in which the bits are Boolean functions of the parameters. Next, in the second, online, stage the parameterized configuration is rapidly evaluated in a configuration update (the actual configuration bits). The configuration update is then applied using DPR. Finally, the FPGA is running this new specialized configuration. This methodology results in a low specialization overhead due to the rapid evaluation of the new specialized configurations. With the introduction of a PConf, every FPGA capable of DPR can be used for fault emulation, without extra design effort.

By way of example, a particular implementation of the test set generation procedure as shown in FIG. 7 is described in more detail below, illustrating standard and optional features of embodiments of the present invention. In order to create FPGA based emulation environment important subtasks have to be designed, besides the fault injection tool, such as the input generator and the output correctness circuitry technique, within an Automatic Test Pattern Generator (ATPG).

Automatic Test Pattern Generation: An Automatic Test Pattern Generation (ATPG) technique finds a test sequence that enables automatic test equipment to distinguish between correct and faulty circuit behaviour. The effectiveness of ATPG is measured by the coverage. In order to check if the test set is capable of detecting a fault, the outputs of the CUT and of the initial fault free version defined as golden reference circuit, are compared under the same input stimulus. If the outputs differ, the fault is detected and the test vector that detected it, is stored in the final test set. The process repeats for each single stuck-at fault. Thereby, when a specific level of fault coverage is achieved, the ATPG terminates resulting to the test set. This test sequence can be applied to check for errors in the design.

Parameterized Test Pattern Generation: Based on ATPGs, we propose a Parameterized Test Pattern Generation (PTPG) flow, that produces the input patterns needed to identify all faults with the use of test set generation and finds a test set efficiently. This PTPG forms the online tool flow described in FIG. 7. The emulation environment that we have built for that purpose was designed in order to implement circuits to be tested on FPGAs.

1). Test set generation cycle: Fast test set generation cycle designs' efficiency is essential, therefore random tests have been selected, as it is easier to design them. Also, it is faster to generate random test inputs and select a viable test by emulation, then to effectively search for a test that detects the fault. So, a Linear Feedback Shift Register (LFSR) has been selected to generate pseudo-random inputs, as it is impractical to test all possible inputs. LFSR creates repeatedly new vectors to be tested in the fault emulation circuitry and is applied simultaneously with the deterministic testing algorithm in order to detect a fault. The initial circuit and the CUT have to be compared for every different input set. If a fault is detected it keeps logs so that the appropriate test can be generated. A XOR gate is used to check if the output of the CUT is the same as with the golden reference circuit, because it is easy to implement in hardware. The possible outputs of the golden reference circuit and the CUT are XORed and if the output is equal to 1 the outputs of the correct and faulty circuit are different. Hence, a fault is detected and the vector generated by the LFSR is stored. The stored fault vectors form the test set.

2). Algorithm: Taking into consideration that the parameters have to be infrequently changing inputs during the emulation and that we want to use parameters for different faults, we want to change faults only after all tests related to that fault are done. Therefore, the fault emulator will activate one fault each time, which is consistent with the single stuck-at fault concept. Afterwards, a generic VHDL module starts creating inputs for the golden reference circuit and the CUT. If the outputs differ given the same input, an output correctness analysis circuitry detects the difference and therefore the input vector is stored for further use.

Then, the FPGA is reconfigured with a different PConf in order to activate a different fault location. When the fault coverage is achieved, the test vectors that are stored form the test set. Optimizations of the test set can still be done and can also use our emulation technique, but that is out of the scope of this paper. Thus, after ASIC fabrication, the actual device under test (DUT) will be tested with these tests found on the golden circuit with injected faults. This is described in FIG. 7.

In an example provided herein below, a method comprising parameterized fault injection in accordance with embodiments of the present invention is evaluated with the use of different mappers after the creation of the circuit under test. These results show that this approach, illustrated schematically above, only has a small impact on the area use in the device. Thus, such approach may scale very well, such that it may be efficiently applied to larger designs.

In this example the TCON tool flow was used for allowing the dynamic reconfiguration of the FPGAs routing resources. Since modified instrumentation-based fault injection methodology is used in accordance with embodiments of the present invention, a low specialization overhead has to be maintained. The specialization overhead consists of the area overhead and the runtime overhead. The area overhead consists of the FPGA resources needed for the valuation and reconfiguration processes and the runtime overhead is the time needed for a test set to be generated through PConf. The TCON tool flow, which uses TLUTs and TCONs absorbs most of the area overhead in the routing infrastructure.

For the area overhead, the proposed approach is compared with the conventional approach. In the prior art approaches such as ABC, one can only include the fault injection with a large area overhead, while using embodiments of the present invention, one can do the same with almost no area for TCONMap and TLUTMap. The conventional fault modelling adds multiplexers everywhere a fault is introduced. So the traditional techniques do not scale and therefore cannot be applied to larger designs. With a methodology according to embodiments of the present invention, after the parameterisation of the MUX-select signal and the SA0/SA1 fault one has minimal area overhead. Therefore, the proposed technique does scale very well, making it feasible to be applied in larger designs.

TABLE I

| | Golden | TMAP | TCON | ABC |
|---|---|---|---|---|
| s349 | 44 | 50 | 41 | 237 |
| s510 | 105 | 133 | 106 | 346 |
| s1196 | 217 | 302 | 253 | 861 |
| s1238 | 241 | 337 | 289 | 869 |
| s1423 | 160 | 220 | 210 | 1049 |
| s1488 | 269 | 400 | 334 | 1027 |
| s1494 | 272 | 408 | 343 | 1010 |

Figure 8:
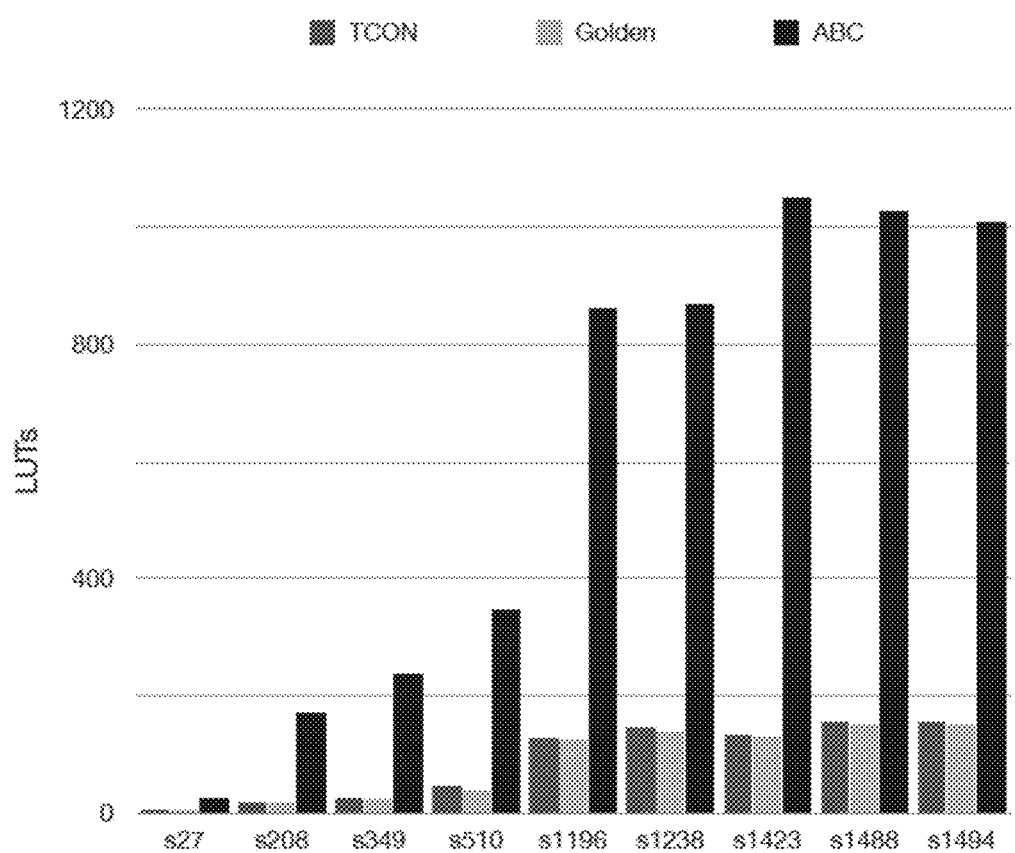
FIG. 8 shows an area comparison with different mapping solutions. The initial area (golden) that is needed for the benchmark is compared with different mappers for the fault injected circuit, TCONMap and ABC with 4-input LUTs. The drawings are only schematic and are non-limiting.

The results are shown in FIG. 8. Indeed, the results regarding the area needed, prove that with the use of the methodology according to embodiments of the present invention, there is a minimal impact regarding the area. FIG. 8 thus shows an area comparison with the conventional mapper and the golden reference circuit. The initial area (golden) that is needed for the benchmark is compared with different mappers for the fault injected circuit, TCONMap and ABC with 4-input LUTs.

In a further example, stuck-at fault signal is set as a non-parameter. Even though this caused a slight increase in the area overhead, the TCONMapper created a significant amount of TCONs and TLCs. Because a reconfigurable virtual multiplexer network in the FPGA's routing infrastructure was aimed at, the extra area is addressed in the routing resources with TCONs. Since TCONs are designed to take advantage of the multiplexers, single stuck-at fault was treated as a non-parameter. Adapting the fault injection accordingly may thus transform the problem in a better case for TCONMap. Even though the area usage may increase compared to the previous example hereinabove, as less parameters are used, it was observed that in the present example the TCON tool flow still behaved better than conventional mappers. Additionally, it behaved better than the TLUT mapper, a technology mapping solution that contains TLUTs. The results are shown in the table I listing area results expressed in LUTs.

An additional advantage is that the specialized configurations fault injection methodology has a reduced logic depth in comparison with its corresponding conventional implementations. Logic Depth is defined as the maximum number of LUTs a signal needs to travel through to get from the input to the output. In a next example, the stuck-at fault signal is indicated again as a parameter. Aiming at an even minimized area overhead, the TCON tool flow was used with 6 input LUTs. The results shown in table II herein below indicate that such minimal area overhead can be achieved. This table lists an area comparison between the initial circuit and the fault injected version mapped respectively with 6-input LUTs, TCONMAP and ABC. The results shown indicate that indeed the area overhead and the depth can be kept minimal.

TABLE II

|  | Golden | TCON | ABC |
|---|---|---|---|
| s27 | 4 | 4 | 27 |
| s208 | 18 | 19 | 170 |
| s349 | 24 | 25 | 237 |
| s510 | 39 | 45 | 346 |
| s1196 | 124 | 126 | 861 |
| s1238 | 137 | 144 | 869 |
| s1423 | 129 | 130 | 1049 |
| s1488 | 148 | 153 | 1027 |
| s1494 | 149 | 153 | 1010 |

The runtime overhead depends on the number of times the emulator needs to be reconfigured and by the reconfiguration overhead, the time to evaluate the PConf and reconfigure the bits that changed.

The frequency of reconfiguration depends on the PTPG. It needs to be reconfigured when a new fault needs to be activated. Therefore, the time overhead can be expressed as the single specialization time (for specializing the FPGA once) multiplied by the number of times a new fault will be activated. The single specialization time depends on the evaluation time and the time required for reconfiguration.

They are both influenced by the number of TLUTs and TCONs. The TCONMap algorithm reduces the contribution of logic block delays to the critical path delay by reducing the number of lookup tables (TLUTs) and the routing infrastructure on the critical path. From table III, one can observe that the logical depth of the design remains constant after the fault injection and the use of TCONMap. In fact, the logic depth decreases with a factor of 5 to 8, compared to the conventional methodology.

The online specialization stage of the TCON tool flow also requires extra processing power to evaluate the Boolean functions in the parameterized configuration produced by the offline generic stage of the TCON tool flow. An embedded processor can be used to evaluate the Boolean functions within one clock tick of the design clock. Also, one parameterized reconfiguration is highly dependent on the complexity of the Boolean function, and needs maximum 50 µs. Thus, each parameterized configuration can be 3 orders of magnitude faster than a full reconfiguration, which is typically 176 milliseconds for a Xilinx Virtex-5 FPGA.

TABLE III

|  | Golden | TCON | ABC |
|---|---|---|---|
| s27 | 1 | 1 | 8 |
| s208 | 3 | 3 | 12 |
| s349 | 3 | 3 | 20 |
| s510 | 3 | 3 | 14 |
| s1196 | 5 | 5 | 25 |
| s1238 | 5 | 5 | 25 |
| s1423 | 10 | 10 | 61 |
| s1488 | 3 | 3 | 18 |
| s1494 | 3 | 3 | 18 |

Figure 9:
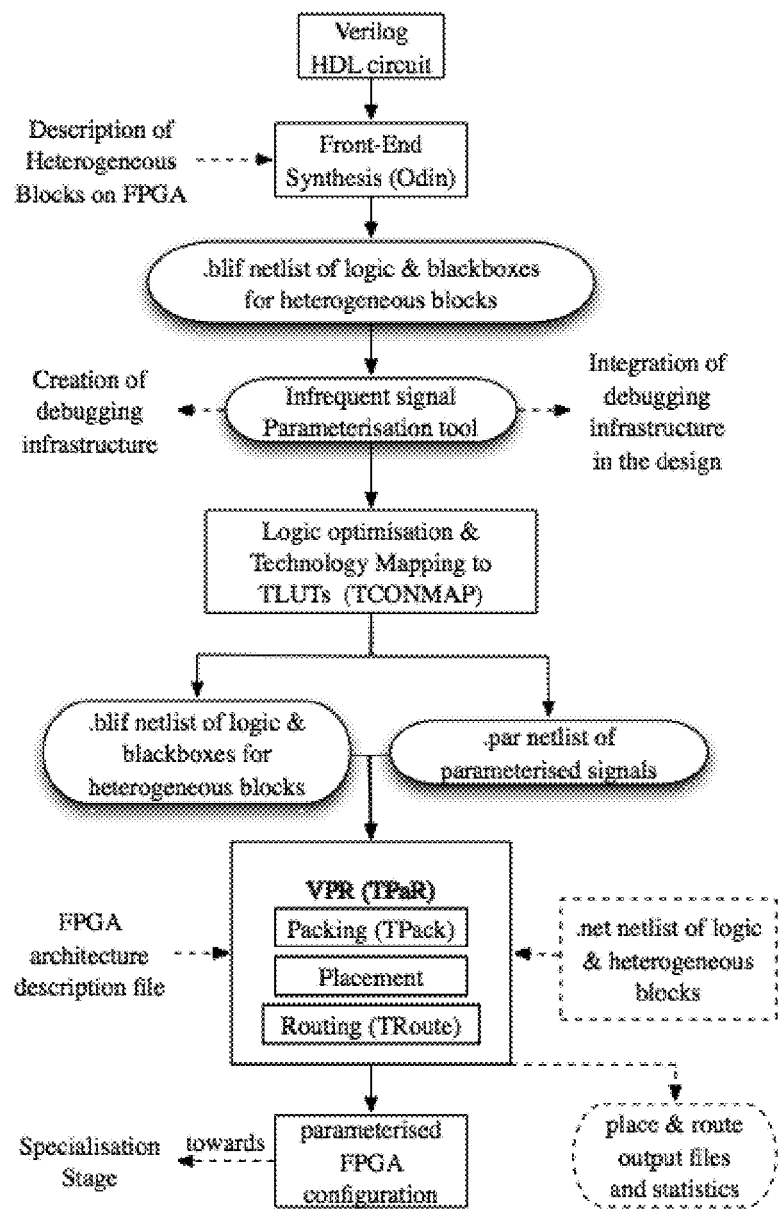
FIG. 9 illustrates a method for testing as could be used according to an embodiment of the present invention.

For further analyzing the system, it has been integrated within VTR 6.0, being a framework for conducting FPGA architecture and CAD research and development. The software flow is initiated with a Verilog hardware description of digital circuits and a file describing the target hypothetical architecture. A description of the heterogeneous blocks on e.g. the FPGA is provided. The software flow then elaborates, synthesizes, packs, places and routes the circuit and it performs timing analysis on the result. The flow is, by way of illustration, shown in FIG. 9 illustrating the different steps, including the use of Verilog hardware description of the digital circuit and the description of heterogeneous blocks on the FPGA as input for a front-end synthesis (Odin). This leads to a blif netlist of logic & blackboxes for heterogeneous blocks. An infrequent signal parameterization tool results in the creation of a debugging infrastructure and integration of debugging infrastructure in the design. Logic optimization and technology mapping to the TLUTs results in .blif netlist of logic & blackboxes for heterogeneous blocks as well as .par net list of the parameterized signals which proceed to a VPR performing packing, placement and routing. An FPGA architecture description file and .net netlist of logic & heterogeneous blocks may be used as input, the VPR providing the parameterized FPGA configuration which can be sent to a specialization stage. The VPR also provides place & route output files and statistics.

The system further has been tested in a hybrid framework that supports both parameterized configuration and debugging infrastructure within the normal VTR flow.

Experimental results in a parameterized test pattern generator demonstrates the practicality of the proposed technique, illustrating that compared to conventional tools, a speedup of three order of magnitude, an 8 times reduction in area and no increase in critical path delay.

It was shown that the debugging infrastructure can be integrated in a design with minimal impact. In order to show this, larger benchmarks were applied. The experiments were conducted with the largest ISCAS89 benchmarks and with the VTR benchmarks. They indicate that only the area for the largest circuit instance implementation is needed, instead of the sum of areas of the initial and the added implementation. This enables to include the infrastructure without much area overhead. Moreover, the implementation with the PConf in many cases is even smaller than the original design, despite the extra circuitry. Hence, the free space can be used for the debugging infrastructure, and more specifically for the insertion of trace buffers, to handle the limited internal signal observability. The area results of the method were compared with two conventional tools that are often used in FPGA mapping. The first is SimpleMAP and the second is ABC that is additionally a part of the VTR flow. The area produced with the proposed method is approximately 3.5× smaller than with the conventional mappers, and it can be up to 23% smaller than the Golden circuit.

TABLE IV

| Benchmark | #Gate | Golden | SM | ABC | Proposed (TLUTs/TCONs) |
|---|---|---|---|---|---|
| stereov. | 215 | 208 | 553 | 590 | 190 (8/332) |
| diffeq2 | 419 | 422 | 1719 | 1819 | 325 (2/712) |
| diffeq1 | 582 | 575 | 2556 | 2659 | 491 (4/1065) |
| clma | 8381 | 4461 | 23694 | 23219 | 7707 (1252/7935) |
| or1200 | 3136 | 3084 | 9769 | 10958 | 3004 (9/2986) |
| frisc | 6002 | 2747 | 11517 | 11412 | 5881 (2333/4910) |
| s38417 | 6096 | 3462 | 20695 | 21040 | 6204 (1495/5597) |
| s38584 | 6281 | 2906 | 20687 | 21032 | 6204 (1495/5597) |

Area results in LUTs: The first column contains the number of gates and the next column the initial design in terms of LUTs. The other columns contain the area results after the insertion of the debugging infrastructure. SM (SimpleMAP) and ABC are the conventional mappers. The last column describes the results of the proposed technique.

TABLE V

| Benchmark | Golden | SimpleMap | ABC | Proposed |
|---|---|---|---|---|
| stereov. | 4 | 5 | 5 | 4 |
| diffeq2 | 14 | 15 | 15 | 14 |
| diffeq1 | 15 | 15 | 15 | 14 |
| clma | 11 | 11 | 11 | 11 |
| or1200 | 27 | 28 | 28 | 27 |
| frisc | 14 | 14 | 14 | 14 |
| s38417 | 7 | 8 | 8 | 7 |
| s38584 | 7 | 8 | 8 | 7 |

The logic depth (inversely related to clock speed) of the design, after adding the extra debugging infrastructure, was either remained the same or reduced, compared to the two conventional mappers. The critical path delay can be up to 8 times smaller compared to conventional mappers and can remain the same with the golden circuit, after the addition of the extra hardware.

The invention claimed is:

1. A method for debugging a circuit design on a programmable logic device, the method being executed by a processor executing computer readable code stored on a non-transitory computer-readable medium or the method being implemented on a hardware system comprising a circuit design component and a debug component, the method comprising:
    inserting multiplexers in an existing design at signal locations whose value should be observable in a debugging phase, where selection bits of the multiplexers are parameters defining when a signal is observable and when a signal is not observable,
    compiling an enhanced version of a design specification of an integrated circuit to a specification of a parameterized version of a configuration for the programmable logic device, with the multiplexer selection bits as parameters,
    programming the programmable logic device in accordance with said specification of the parameterized version of the configuration, said programming comprising adding a plurality of tunable connections to the specification of the parameterized version of the configuration for routing a plurality of internal signals to at least one trace buffer, each tunable connection allowing routing exactly one internal signal of said plurality of internal signals to exactly one trace buffer of said at least one trace buffer when the tunable connection is set to an active state by a corresponding parameter, and
    debugging the programmable logic device while executing said specification of the parameterized version of the configuration, wherein said debugging comprises reconfiguring the programmable logic device for selecting a subset of the plurality of internal signals to route to the at least one trace buffer, wherein this reconfiguring comprises applying a parameterized version of a run-time reconfiguration of at least one routing configuration cell of the programmable logic device in accordance with said specification of the parameterized version of the configuration.

2. The method according to claim 1, wherein selecting a subset of the plurality of internal signals comprises selecting a subset of multiplexer selection bits for selecting signals for the signal locations to be observable during the debugging.

3. The method according to claim 1, wherein the method comprises co-optimizing a debugging functionality and the circuit design, during a design cycle.

4. A method for debugging a circuit design on a programmable logic device, the method being executed by a processor executing computer readable code stored on a non-transitory computer-readable medium or the method being implemented on a hardware system comprising a circuit design component and a debug component, the method comprising:
    inserting multiplexers in an existing design specification at signal locations whose value should be selectively observable during debugging, where selection bits of the multiplexers are parameters defining when a signal is observable and when a signal is not observable, thereby forming an enhanced version of a design specification of an integrated circuit,
    compiling the enhanced version of the design specification of the integrated circuit to a specification of a parameterized version of a configuration for a programmable logic device, with the multiplexer selection bits as parameters,
    programming the programmable logic device in accordance with said specification of the parameterized version of the configuration, and
    debugging the programmable logic device while executing said specification of the parameterized version of the configuration, wherein said debugging comprises applying a parameterized version of a run-time configuration of the programmable logic device in accordance with said specification of the parameterized version of the configuration taking into account the selection bits of the multiplexers in accordance with signals to be observed during the debugging.

5. The method according to claim 4, wherein said programming the programmable logic device comprises an automatic generation of the parameterized configuration of the programmable logic device.

6. The method according to claim 5, wherein said automatic generation comprises the steps of synthesis, technology mapping, placement and routing.

7. The method according to claim 4, wherein the method comprises co-optimizing a debugging functionality and the circuit design, during a design cycle.

8. The method according to claim 4, wherein said compiling of the enhanced version of the design specification of the integrated circuit to the specification of the parameterized version of the configuration comprises inserting multiplexers for routing internal signals to trace buffers.

9. A method for generating a test set of a circuit design on a programmable logic device, the method being executed by a processor executing computer readable code stored on a non-transitory computer-readable medium or the method being implemented on a hardware system comprising a circuit design component and a debug component, the method comprising
inserting multiplexers in an existing design at signal locations where a signal fault can be generated,
where selection bits of the multiplexers are parameters defining when a signal fault occurs and when no signal fault occurs, thus forming an enhanced version of a design specification of an integrated circuit.

10. The method according to claim 9, wherein the method comprises co-optimizing a debugging functionality and the circuit design, during a design cycle.

11. The method according to claim 9, the method further comprising:
compiling the enhanced version of a design specification of an integrated circuit to a specification of a parameterized version of a configuration for the programmable logic device, with the multiplexer selection bits as parameters,
programming the programmable logic device in accordance with said specification of the parameterized version of the configuration, and
testing the programmable logic device while executing said specification of the parameterized version of the configuration, wherein said testing comprises applying a parameterized version of a run-time configuration of the programmable logic device in accordance with said specification of the parameterized version of the configuration taking into account the selection bits of the multiplexers in accordance with signal faults occurring for said testing.

12. The method according to claim 11, wherein said compiling the the enhanced version of the design specification of the integrated circuit to the specification of the parameterized version of the configuration specification comprises injecting at least one parameterized signal fault in the specification of the parameterized version of the configuration and/or furthermore comprising testing the programmable logic device while executing said specification of the parameterized version of the configuration,
wherein said testing comprises reconfiguring the programmable logic device for selecting a selection of the at least one parameterized fault and/or wherein testing comprises applying a Parameterized Test Pattern Generation procedure or comprises applying the Parameterized Test Pattern Generation procedure comprising selecting random tests.

13. The method according to claim 11, wherein the method comprises co-optimizing a debugging functionality and the circuit design, during a design cycle.

14. A debugging system for debugging a circuit design on a programmable logic device, the debugging system comprising:
a circuit design component adapted for implementing a parameterized specification of a programmable logic device for a circuit design to be debugged, the parameterized specification comprising a plurality of tunable connections for routing a plurality of internal signals to at least one trace buffer, each tunable connection being adapted for routing exactly one internal signal of said plurality of internal signals to exactly one trace buffer of said at least one trace buffer when the tunable connection is set to an active state by a corresponding parameter, and
a debugging component configured for debugging the programmable logic device while executing said specification of the parameterized version of the configuration, wherein said debugging component is adapted for reconfiguring the programmable logic device for selecting a subset of the plurality of internal signals to route to the at least one trace buffer, wherein this reconfiguring comprises applying a parameterized runtime reconfiguration of at least one routing configuration cell of the programmable logic device in accordance with said specification of the parameterized version of the configuration.

15. The debugging system according to claim 14, the debugging system being configured for performing the method comprising:
inserting multiplexers in an existing design at signal locations whose value should be observable in the debugging phase, where the selection bits of the multiplexers are parameters defining when a signal is observable and when not,
compiling an enhanced version of a design specification of an integrated circuit to a specification of a parameterized version of a configuration for a programmable logic device, with the multiplexer selection bits as parameters,
programming the programmable logic device in accordance with said specification of the parameterized version of the configuration, said programming comprising adding a plurality of tunable connections to the specification of the parameterized version of the configuration for routing a plurality of internal signals to at least one trace buffer, each tunable connection being adapted for routing exactly one internal signal of said plurality of internal signals to exactly one trace buffer of said at least one trace buffer when the tunable connection is set to an active state by a corresponding parameter, and
debugging the programmable logic device while executing said specification of the parameterized version of the configuration, wherein said debugging comprises reconfiguring the programmable logic device for selecting a subset of the plurality of internal signals to route to the at least one trace buffer, wherein this reconfiguring comprises applying a parameterized runtime reconfiguration of at least one routing configuration cell of the programmable logic device in accordance with said specification of the parameterized version of the configuration.

16. The debugging system according to claim 14, wherein the circuit design component is adapted for inserting multiplexers in an existing initial design specification at signal locations whose value should be selectively observable during debugging, where selection bits of the multiplexers are parameters defining when a signal is observable and when a signal is not observable, thus obtaining an enhanced integrated circuit design specification for said implementing a parameterized specification of the programmable logic device.

17. The debugging system according to claim 14, wherein the debugging component furthermore comprises an output means for outputting the internal signals representative of the circuit design or its operation or wherein the debugging system furthermore comprises a feedback component for reconfiguring the tunable connection based on the obtained internal signals.

18. A test set generation system for generating a test set of a circuit design on a programmable logic device, the test set generation system comprising
   a circuit design component adapted for inserting multiplexers in an existing design at signal locations where a signal fault can be generated,
   where selection bits of the multiplexers are parameters defining when a signal fault occurs and when a signal fault does not occur.

19. The test set generation system according to claim 18, the design component co-optimizing a debugging functionality and the circuit during the design cycle.

20. The test set generation system according to claim 18, the test set generation system being configured for performing a method comprising:
   inserting the multiplexers in the existing design at the signal locations whose value should be observable in the debugging phase, where the selection bits of the multiplexers are parameters defining when a signal is observable and when a signal is not observable,
   compiling an enhanced integrated circuit design specification to a specification of the parameterized version of the configuration for the programmable logic device, with the multiplexer selection bits as the parameters,
   programming the programmable logic device in accordance with said specification of the parameterized version of the configuration, said programming comprising adding a plurality of tunable connections to the specification of the parameterized version of the configuration for routing a plurality of internal signals to at least one trace buffer, each tunable connection being adapted for routing exactly one internal signal of said plurality of internal signals to exactly one trace buffer of said at least one trace buffer when the tunable connection is set to an active state by a corresponding parameter, and
   debugging the programmable logic device while executing said specification of the parameterized version of the configuration, wherein said debugging comprises reconfiguring the programmable logic device for selecting a subset of the plurality of internal signals to route to the at least one trace buffer, wherein this reconfiguring comprises applying a parameterized runtime reconfiguration of at least one routing configuration cell of the programmable logic device in accordance with said specification of the parameterized version of the configuration.

* * * * *